United States Patent [19]

Wolffenbuttel

[11] Patent Number: 4,749,851

[45] Date of Patent: Jun. 7, 1988

[54] METHOD AND CIRCUIT FOR DETERMINING THE WAVE-LENGTH OF LIGHT

[75] Inventor: Reinoud F. Wolffenbuttel, Ca Abcoude, Netherlands

[73] Assignee: Technische Universiteit Delft, Delft, Netherlands

[21] Appl. No.: 901,646

[22] Filed: Aug. 29, 1986

[51] Int. Cl.$^4$ .................... H01J 40/14; H01J 5/16; G01J 3/50

[52] U.S. Cl. .................... 250/211 J; 250/226

[58] Field of Search ............ 357/30 G, 30 L, 22 B, 357/22 F, 91; 250/211 J, 226; 356/411

[56] References Cited

U.S. PATENT DOCUMENTS 3,366,802  1/1968  Hilbiber ........................ 357/22 B
4,264,857  4/1981  Jambotkar ..................... 357/22 F Primary Examiner—David C. Nelms
Assistant Examiner—Michael Messinger
Attorney, Agent, or Firm—Cushman, Darby & Cushman

[57] ABSTRACT

Method and system for determining the wave-length of light impinging onto the surface of a light sensitive semiconductor structure by determining the photocurrent therethrough. The semiconductor structure consists of a substrate of one conductivity type, an adjoining epitaxial layer of a second conductivity type, and thereon a doped region of the first conductivity type. At least two different reverse voltages are applied across the epitaxial layer and said doped region, creating thereby different depletion zones in the epitaxial layer. Measures are taken for completely depleting the remaining section of the epitaxial layer underneath said depletion zone. For each reverse voltage the photo current is measured and the measured values are supplied through a matrix process combined to obtain a filter response.

19 Claims, 14 Drawing Sheets

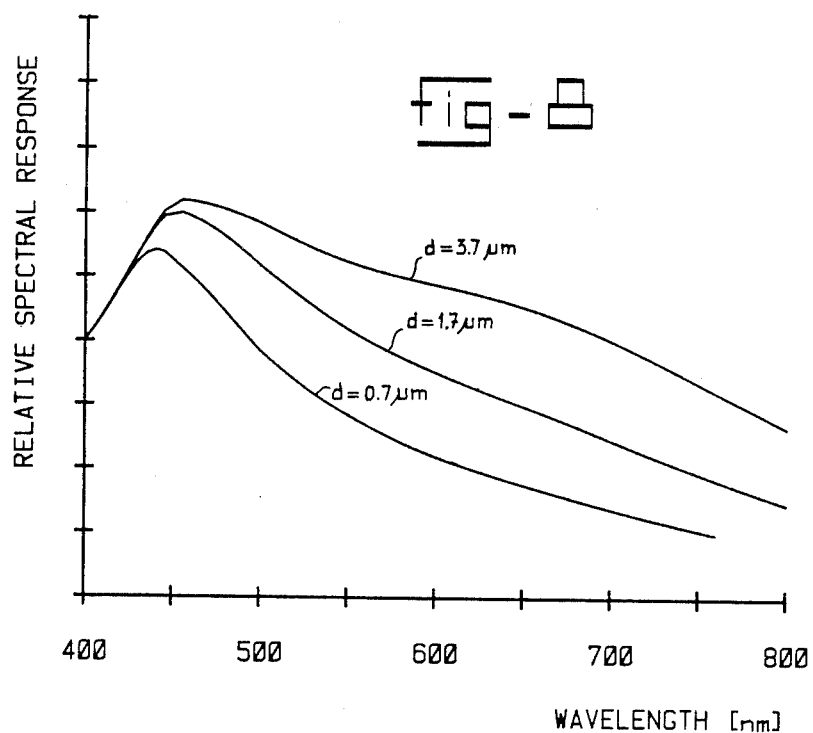
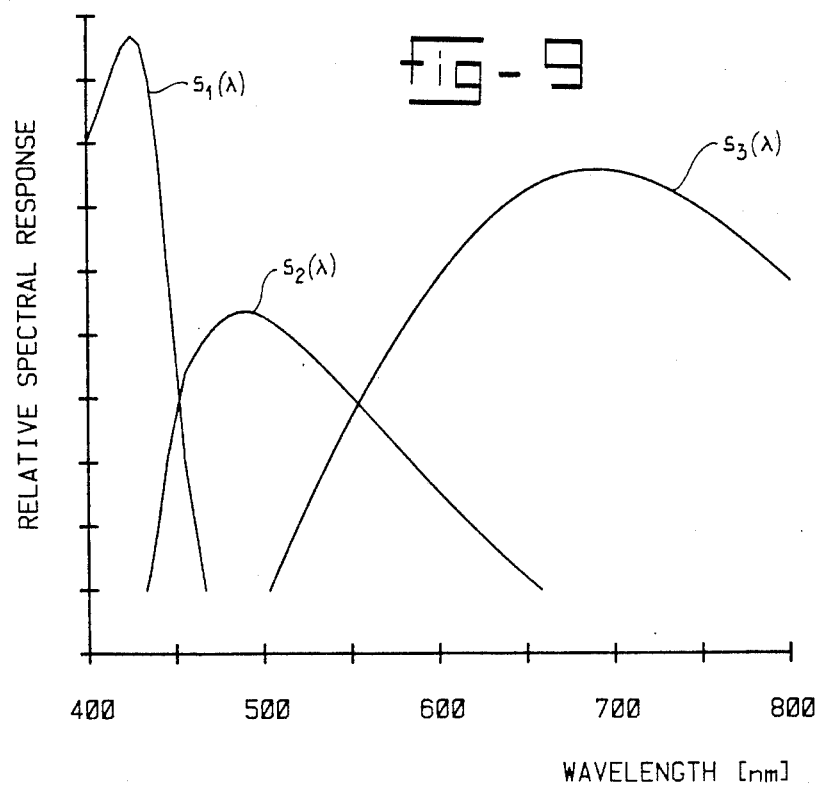

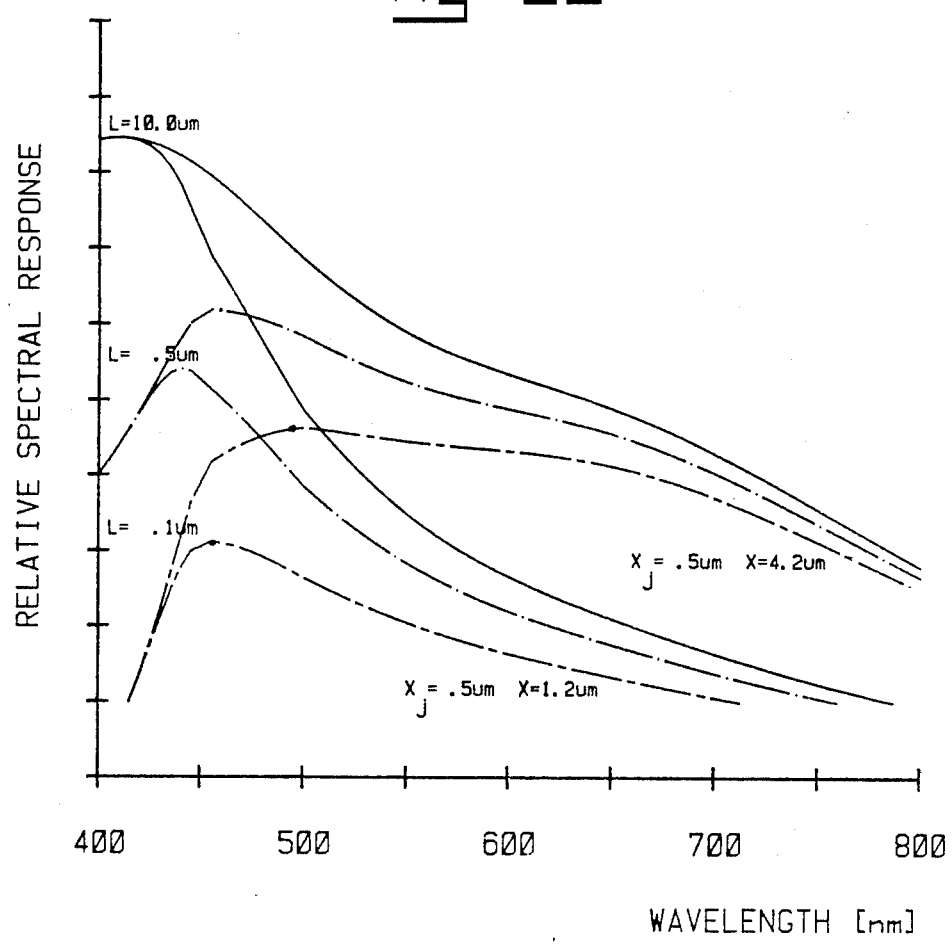

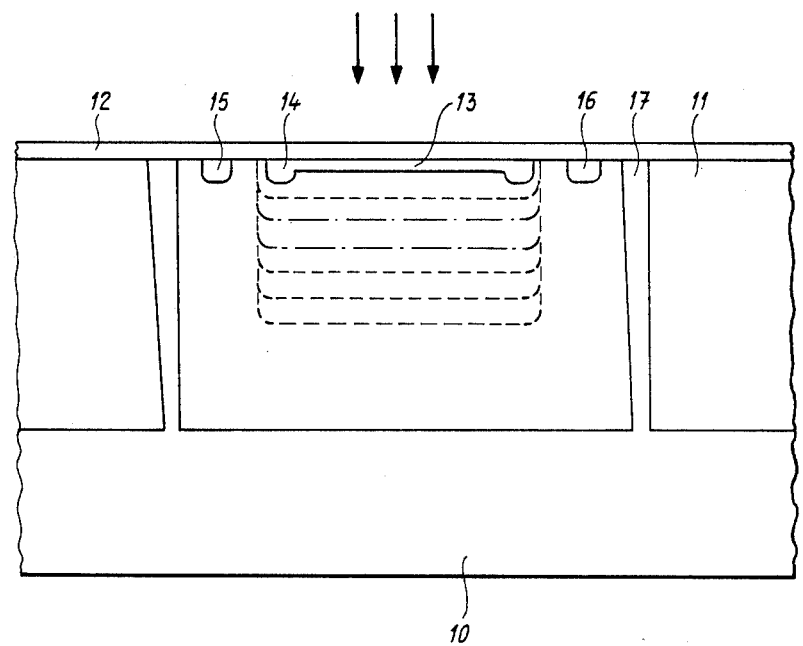

METHOD AND CIRCUIT FOR DETERMINING THE WAVE-LENGTH OF LIGHT

BACKGROUND OF THE INVENTION

The invention relates to a method for determining the wavelength of light impinging onto the surface of a light sensitive semiconductor structure, and relates furthermore to a color-sensitive sensor circuit comprising such a light sensitive semiconductor structure.

Before explaining the details of the specific method and circuit according to the invention, a number of different light sensitive semiconductor structures, known from various publications, will be discussed to delimit the state of the art.

In the article "Colour imaging system using a single CCD area array", published in IEEE Transactions on Electronic Devices ED-25, Nr. 2, (1978), pages 102–107, a color-sensitive device is described which is in principle a combination of three photo detectors receiving the impinging light through respective optical red, green and blue filters and, applied in a suitable pattern onto the upper side of the sensor surface to realize the actual color filtering. With this construction it is possible to determine the intensity of the corresponding primary or complementary color. From the information provided by the three detectors it is possible to determine the unique position of the color in the CIE color triangle. Large color imaging sensors have already been realized using such techniques. A disadvantage thereof is, however, that for each light sensitive element three diodes are necessary as well as a corresponding color filter for each of them. The relatively complicated construction and the relatively large surface necessary for the construction of an array of such light sensitive elements leads to a rather large drop-out rate during the fabrication thereof.

Further semiconductor structures are proposed in which for each light sensitive element only two diodes are present. The functioning of these known structures is generally based on the fact that the absorption of impinging light into a semiconductor material is largely dependent on the wave-length of the light. Light of short wave-length will be absorbed near the surface of the semiconductor material whereas light of longer wave-length will penetrate deeper into the material before it is absorbed.

This difference in penetration capacity is used in the device described in the U.S. Pat. No. 4,011,016. Therein a light sensitive semiconductor structure is described which in fact comprises two mutually insulated photo diodes at a different level beneath the surface of the semiconductor material. Impinging light of short wave-length will mainly be detected by the diode nearest to the surface, whereas impinging light of longer wave-length will in general be detected by the deeper diode. By comparing the photo currents of both diodes information can be retrieved about the wave-length of the impinging light. The functioning of this known device is based on the fact that different diffusion currents will be generated by illumination with different wave-lengths.

Another semiconductor structure in which use is made of pn-junctions at various depths beneath the light receiving surfae of a semiconductor structure is described in the U.S. Pat. No. 4,107,722.

A disadvantage of these known structures is the fact that still two different pn-junctions for each light sensitive element are necessary, whereas furthermore these two pn-junctions have to be realized at different depths.

A further important disadvantage is that no sharp color filtering is obtained. Only an indication is provided about the average color value, because the color is not excactly reproduced. The response of these prior art sensors on illumination with a combination of red and blue light may be equal to the response on illumination with only green light.

SUMMARY OF THE INVENTION

An object of the invention is to provide a method for determining the wave-length of light impinging onto the surface of a light sensitive semiconductor structure in such a way that the wave-length of the impinging light can be determined unambiguously. A further object of the invention is to provide an electronically turnable optical filter of simple structure suitable for realizing unambiguous color filtering.

In agreement with these objects the invention now provides a method for determining the wave-length of light impinging onto the surface of a light sensitive semiconductor structure by determining the photocurrent through said semiconductor structure. Said structure consisting of a substrate of one conductivity type, an adjoining epitaxial layer of a second conductivity type, and thereon a doped region of the first conductivity type. The photocurrent is determined by applying at least two different reverse voltages across the epitaxial layer and said doped region, said reverse voltages creating a depletion zone in said epitaxial layer under circumstances whereby the remaining section of the epitaxial layer underneath said depletion zone is completely depleted.

Furthermore the invention provides an agreement with the above indicated objects a color-sensitive sensor circuit comprising:

a light sensitive semiconductor diode structure consisting of a substrate of the first conductivity type, an epitaxial layer of the second conductivity type, and thereon a further layer of the first conductivity type, which further layer forms together with the epitaxial layer a photo diode;

a first voltage source which in reverse direction is connected to said photodiode to generate a first depletion zone mainly in said epitaxial layer;

a second voltage source connected in reverse direction to the junction between the substrate and the epitaxial layer to create a second depletion zone in said epitaxial layer; and a current detection circuit connected to said photo diode for detecting the photocurrent, whereby means are present for detecting the complete depletion of the epitaxial layer, which means are generating a control signal for the second voltage source, such that a predetermined voltage of the first voltage source said second voltage source applies such a voltage that the resulting depletion zones in the epitaxial layer are just adjoining, that for at least two different voltages of the first voltage source the photo diode current in such a semiconductor structure is detected, and that a processor circuit is present in which the detected current values are compared with each other to extract out of this comparison information concerning the wavelength of the impinging light.

The functioning of the sensor according to the invention is not based on different diffusion currents, as in the case of the prior art structures comprising two pn-junctions at various depths, but is based on the different drift currents in the depletion zone directly underneath the light sensitive pn-junction.

Based on this main inventive concept it is possible to choose either a time multiplex solution or a position multiplex solution (or mixed embodiments thereof).

A time multiplex embodiment of the color-sensitive sensor circuit according to the invention has the characteristic that at least two different voltages are applied sequentially one after the other, whereby a memory is present in which the detected photo currents are stored thereafter the stored photo current values are simultaneously applied to the processor circuit.

In this circuit, the first voltage source is controlled in such a way that this first voltage source generates a stepwise continuously increasing voltage, the step value of each voltage change being determined by the required slope of the filter curve for filtering the corresponding part of the spectrum. With three different reverse voltages, a distinct sepration of red, green and blue light can be obtained so that the sensor circuit is suited to be applied for instance in a color camera in which an array of n×m light sensitive elements is used. Because the sensor circuit according to the invention needs only one photo diode for each light sensitive element such an array will be significantly simplified in comparison with the prior art array structures.

By selecting a larger number of different reverse voltages an increasingly sharp filtering of rather small bands out of the spectrum can be realized.

A position multiplex embodiment of the color-sensitive sensor circuit according to the invention has the characteristic that said sensor circuit comprises at least two of said semiconductor diode structures each receiving one of said at least two different reverse voltages, whereby the photo currents in said at least two different diode structures are detected simultaneously and applied simultaneously to the processing circuit.

Such a position multiplex embodiment has proven to be specifically useful in case a sharp filtering of small bands out of the complete spectrum is required such as in a spectrum analyser. A time multiplex embodiment would require in such applications a certain period for applying sequentially the whole series of necessary reverse voltages to the only one photo diode. On contrast therewith in the position multiplex embodiment all the various reverse voltages are simultaneously applied each to a separate photo diode. Furthermore the position multiplex embodiment does not require a memory for intermediate storage of the detected photo current values preceding the processing in the processor circuit.

BRIEF DESCRIPTION OF THE DRAWINGS

The invention will be explained in more detail with reference to the accompanying drawings.

FIG. 8 illustrates the relative spectral response as a function of the wave-length for three different revere voltages in the embodiment according to FIG. 5.

FIG. 9 illustrates the relative spectral response after processing in the matrix processing unit.

FIG. 10 illustrates the influence of the diffusion length onto the spectral response.

FIG. 12 illustrates the application of a reverse voltage which is increasing in small steps, by means of which sharp color filtering can be realized.

DETAILED DESCRIPTION OF THE PREFERRED EMBODIMENT

Figure 1:
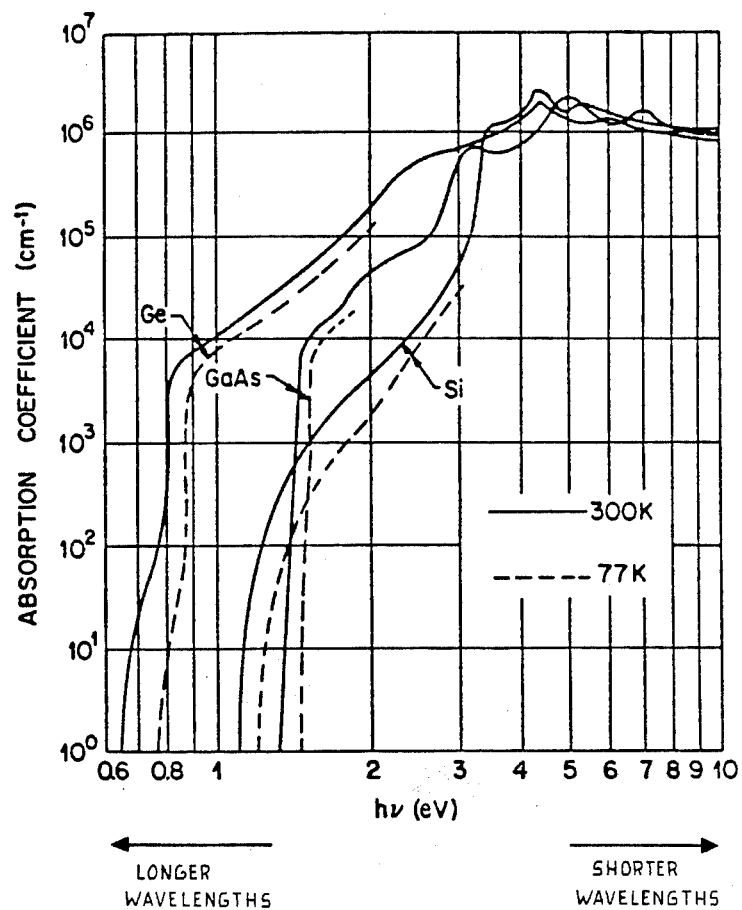
FIG. 1 illustrates the absorption coefficient in various semiconductor materials as function of the photon energy.

The characteristic variation of the intrinsic absorption coefficient in various semiconductor materials as function of the photon energy and therewith as function of the wave-length of the impinging light is shown in FIG. 1. Due to the indirect band gap in silicon, incident photons having an energy in excess of 3.5 eV (equivalent to a wave-length smaller than 350 nm) will allow a direct transition of electrons from the valence band into the conduction band. In the case of incident radiation with an energy in between the band gap energy of 1,12 eV and the energy sufficient to allow a direct transition, an indirect transition could occur provided energy and momentum are preserved. Incident photons are not able to provide momentum, so the probability of such a transition taking place depends on lattice vibration. Therefore, the absorption increases at an increasing energy (equivalent to a decreasing wave-length) since less change in momentum will be required to generate an electron-hole pair at larger energies, resulting in a larger chance of an indirect transition occurring. This wavelength-dependency causes a very shallow absorption of blue light and enables red light to penetrate deeply into the silicon.

Figure 2:
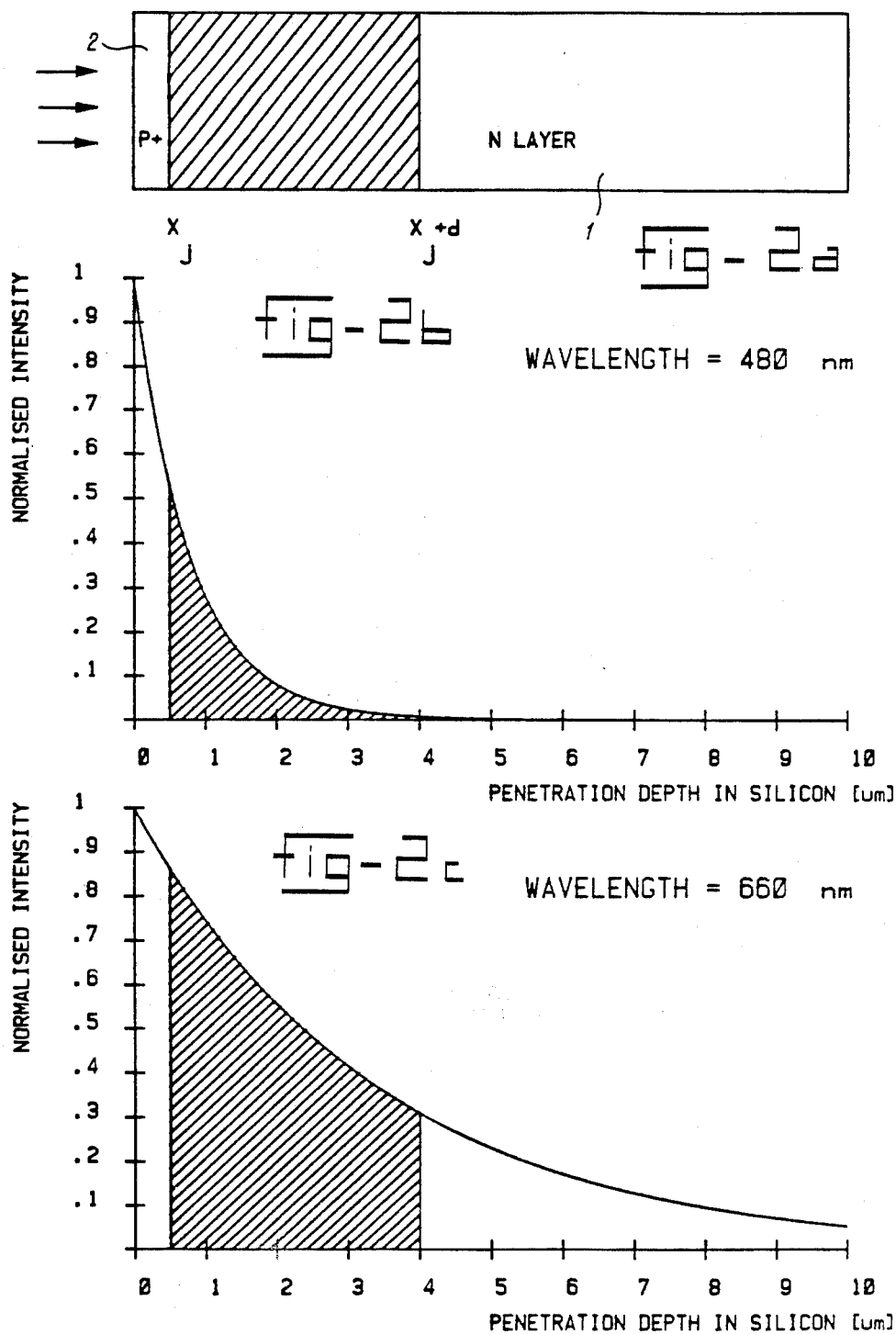
FIG. 2 illustrates the formation of a depletion zone in a photo diode and the resulting photo current for various wavelengths of the impinging light.

The number of charge carriers and therewith the amount of photo current in a photo diode is proportional to the number of absorbed photons and thus depends on the surface area. The horizontal dimensioning of the semiconductor structure is, however, a fixed parameter. In the second place the photo current will depend on the intensity of the impinging light. This will be explained in more detail in the following description. If a mechanism is implemented that collects only the generated charge carriers in a silicon layer below the surface to a defined vertical boundary, then the perceived photo current depends also on the wave-length of the incident light, as will be clear from the explanation above. Such a mechanism will be explained with reference to FIG. 2.

In FIG. 2a a diode structure is schematically illustrated consisting of an epitaxial n layer with a p doped region at the top thereof creating a pn-junction at a short distance $x_j$ underneath the light receiving surface of the structure (at the left hand of the Figure). After applying a reverse voltage to this structure a depletion zone is created, the extension of which depends on the value of the reverse voltage and on the doping profile. In FIG. 2a this depletion zone, extending from the pn-junction at the depth $x_j$ to the boundary at a depth $x_j+d$ is shaded. As a result of the high doping of the p top layer, the depletion zone will extend almost completely into the epitaxial n layer. Furthermore measures are take to deplete the non-shaded area at the right hand of the boundary at the depth $x_j+d$, preventing thereby any diffusion of charge carriers from this area into the shaded area. The specific nature of these measures will be explained below.

In the FIGS. 2b and 2c, absorption photons with different energy, corresponding with wave-lengths of 480 nm and 660 nm respectively, is illustrated as a function of the penetration depth in a silicon semiconductor structure, based on a depletion zone extending from the pn-junction at $x_j=0.5$ $\mu$m to a depth of 4 $\mu$m (d=3.5 $\mu$m). These Figures clearly illustrate the difference in absorption for light with different wave-lengths. The total diode current is proportional to the surface of the shaded area underneath said curves.

Figure 3:
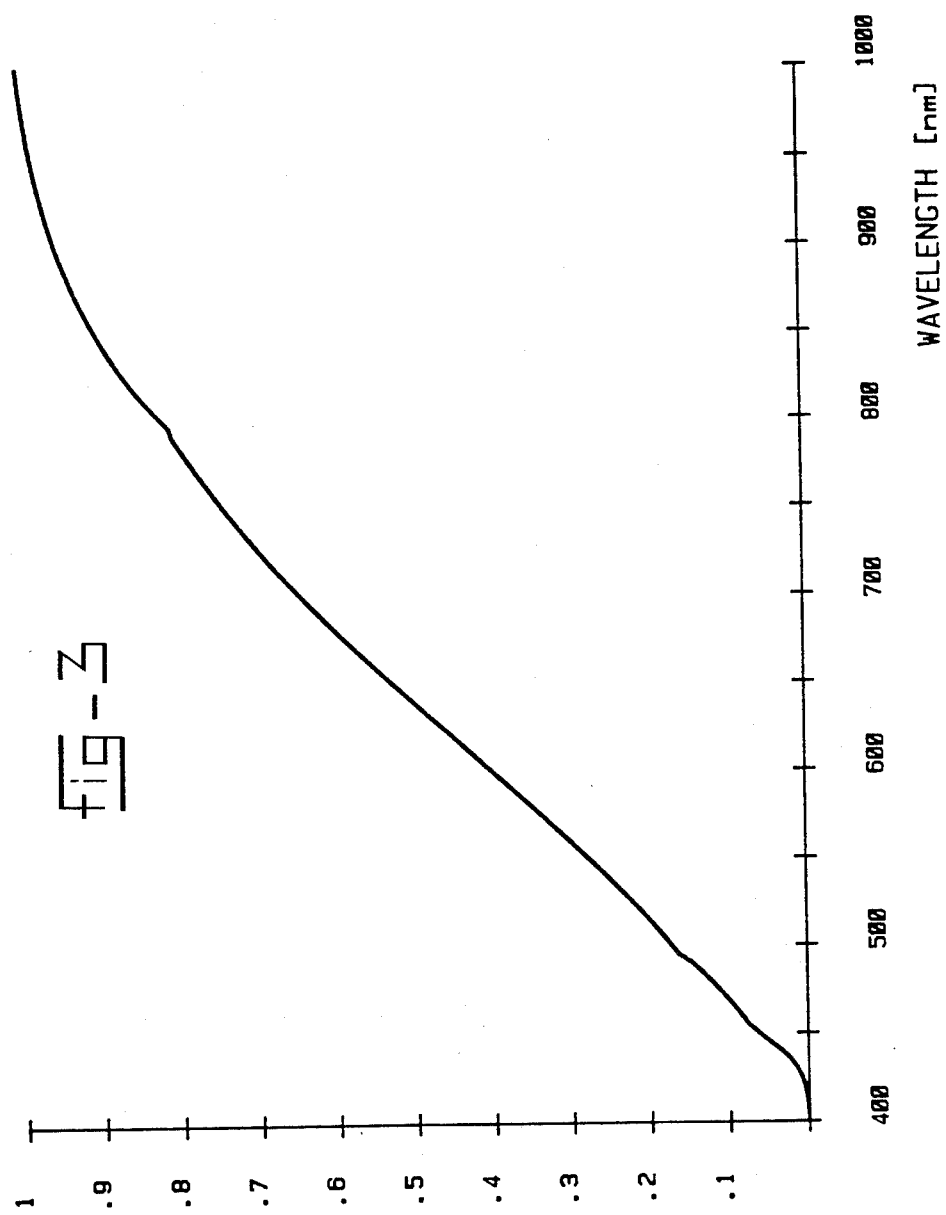
FIG. 3 illustrates for a predetermined width of the depletion zone the photo current as function of the wave-length of the impinging light.

Determining the photocurrent for a predetermined reverse voltage for all wave-lengths within the range between 400 and 1000 nm will result in a curve as illustrated in FIG. 3. Light of very short wave-length, smaller than 400 nm, will be absorbed readily in the p top layer of the semiconductor structure and will not contribute (at least in a first approximation) to the photocurrent. The longer the wave-length, the higher the contribution to the photocurrent.

Figure 4:
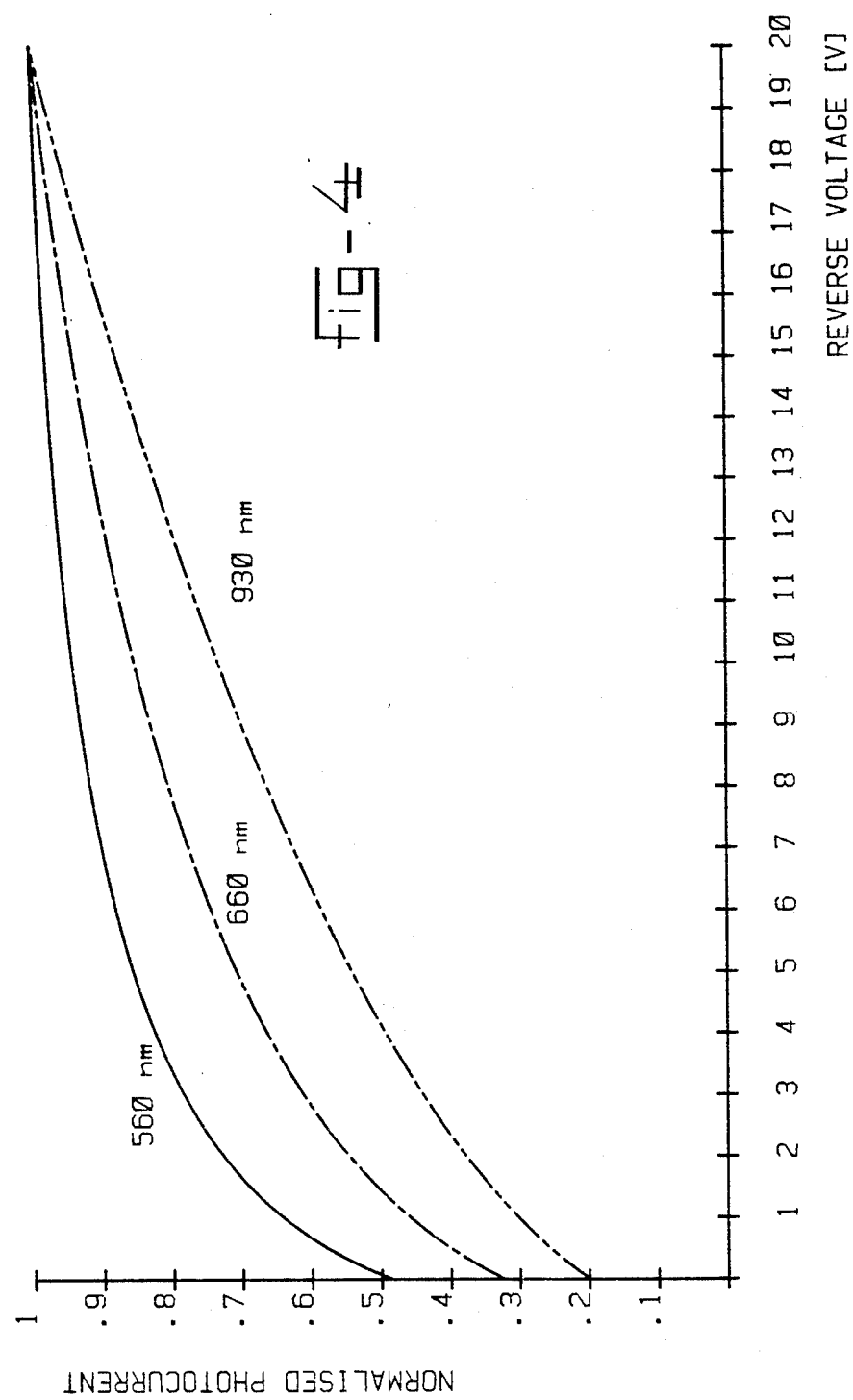
FIG. 4 illustrates the photo current as a function of the reverse voltage for various wave-lengths.

Furthermore it appears from the FIGS. 2b and 2c that the strength of the photocurrent is furthermore dependent on the width d of the depletion zone, in other words is dependent on the reverse voltage. The way in which the photo current varies as a function of the reverse voltage is illustrated in FIG. 4 for various wave-lengths. As appears from FIG. 4, the saturation condition is reached faster at shorter wave-length, which is the result of the smaller penetration depth of shorter wave-length light.

The invention is now supported by the understanding that by increasing the reverse voltage from V to V+$\Delta$V, the increase of the photocurrent will in general be caused by light of specific wave-lengths. As appears clearly from the FIGS. 2b and 2c, an increase of the reverse voltage from 4 V to 5 V will, at a wavelength of 480 nm, result in a significant smaller change of current than at an illumination with a wave-length of 660 nm. If therefore the reverse voltage is stepwise changed with a predetermined step value and if the stepwise change in the photo current is detected, than this change in photo current can only be caused by light of predetermined wave-length. As is described in the following description, this effect is used in the sensor according to the invention.

Figure 5A:
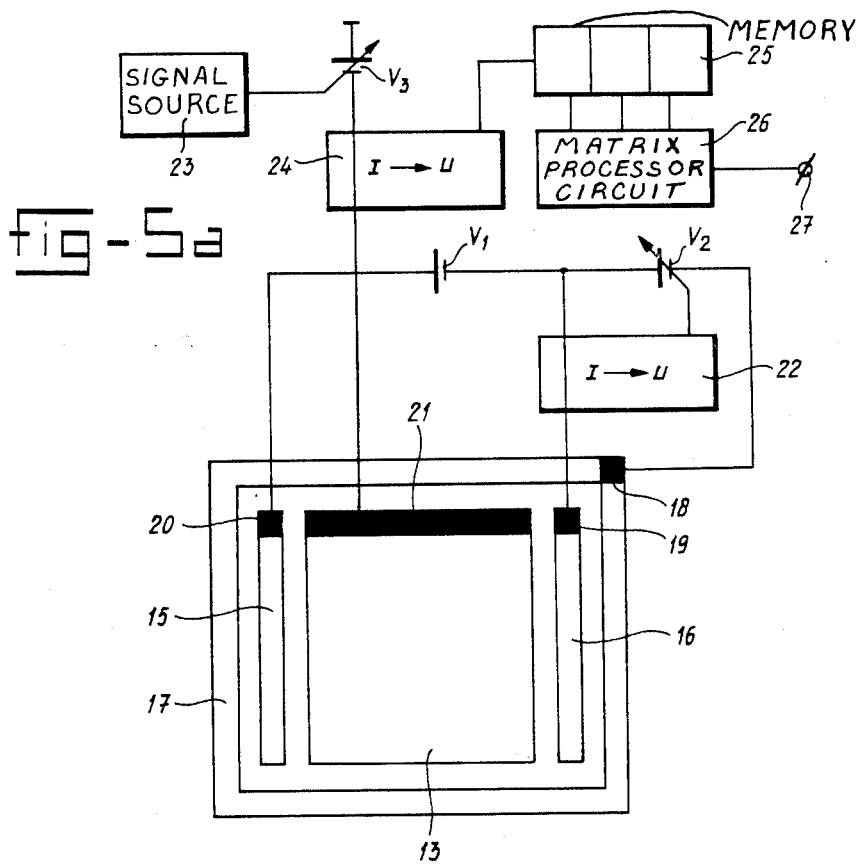
FIG. 5 illustrates schematically a first embodiment of a sensor structure according to the invention.
Figure 5B:
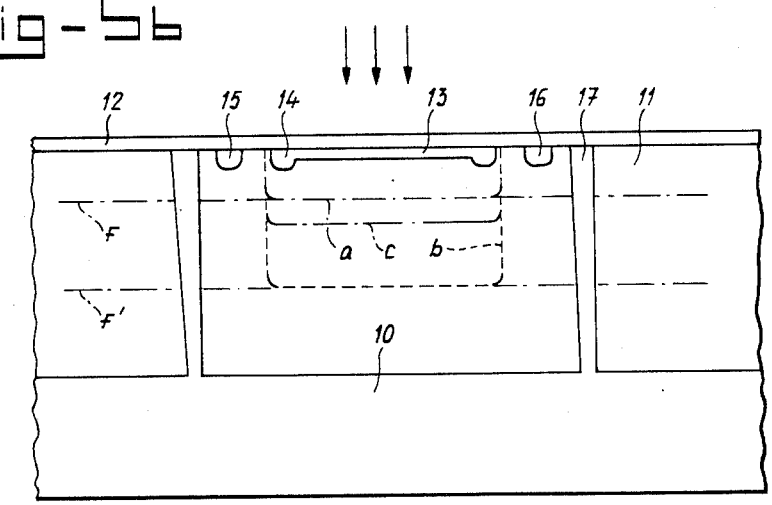

FIG. 5 illustrates a first embodiment of a sensor structure according to the invention. More specifically FIG. 5b illustrates a cross section through the semiconductor structure, whereas FIG. 5a shows an top view thereof, in which the SiO$_2$ layer is removed. Furthermore FIG. 5a illustrates further components of the sensor circuit. Attention is drawn to the fact that the dimensions in these Figures (and in other Figures) are not illustrated to scale. The shown structure comprises a p substrate 10 with thereon an epitaxial n layer 11 in which through a boron implantation a p zone 13 is formed determining a pn-junction with the epitaxial layer at a depth of 0.5 $\mu$m. The implanted p layer is surrounded by a guard ring 14, formed by a local p diffusion, and functioning to increase the punchthrough.

Further elongated n doped regions 15 and 16 are formed in the epitaxial n layer 11, said regions forming together with the epitaxial n layer 11 a JFET, the gates of which are formed by the p layer 13 and the p substrate 10.

As is illustrated in FIG. 5 various metallizations are present, blackened in the Figure, for realizing connections to further components of the circuit. The substrate 10 is connected through the p doped ring 17 to the metallization 18. The source 15 and drain 16 of the JFET are connected to the metallizations 19 and 20, whereas the p layer 13 comprises the metallization 21.

As illustrated in FIG. 5a, the source 15 and drain 16 of the JFET are connected to a voltage source $V_1$. Between the drain 16 and the substrate 10 a second voltage source $V_2$ is connected through the metallizations 19 and 18 respectively, the voltage of said second voltage source $V_2$ being controllable. By means of the current/voltage-converter 22 the current through the JFET is measured and depending on this current, and the corresponding voltage, a control signal for the voltage source $V_2$ is generated in a way as will be described in further detail hereinafter.

The p region 13 is connected through the metallization 21 to the voltage source $V_3$ of which the voltage is controlled by a signal generated by a signal source 23. The current from the p region 13 is detected by means of the current/voltage-converter 24 which in turn delivers an output signal to a memory 25. The output signals of this memory 25 are supplied to a matrix processor circuit 26 delivering a signal to the output 27 of the sensor circuit.

The functioning of this sensor circuit is as follows. With a predetermined reverse voltage $V_3$, set under control of a signal from the signal source 23, a depletion zone will be formed in the epitaxial n layer 11 underneath the p region 13, which depletion zone has for instance a boundary illustrated by means of the dotted line a in FIG. 5b. In this setting, a certain photo current will be generated through the pn-junction as a result of the absorption of photons dependent onto the wave-length of the impinging light (indicated by arrows in FIG. 5b). To take care that no diffusion will take place from charge carriers out of the underlying epitaxial n layer into the depletion zone within the dotted line a, the part of the epitaxial layer underneath the dotted line a has to be depleted completely. For that reason the voltage of the voltage source $V_2$ has to be adjusted such that the thereby created second depletion zone extends from the substrate 10 upwards to the dash-dot line f. It will be clear from FIG. 5b that both depletion zones are just reaching each other without any overlap. In this situation the JFET will be at the point of pinch off. To detect this condition the source-drain-current through the JFET is measured by means of the current/voltage converter 22. On the basis of the measured current, a control signal for the voltage source $V_2$ is generated such that the JFET will be maintained at the point of pinch off assuring thereby that the whole epitaxial n layer underneath the dotted line a is depleted.

Under these circumstances the current, detected by the converter 24, will only be caused by (1) charge carriers generated by the impinging photons in the depletion zone within the dotted line a and (2) charge carriers which will be generated by the impinging photons in the p region 13 and diffusing into the depletion zone bounded by the dotted line a. The voltage value corresponding to this photo current will be supplied by the converter 24 to the analog memory 25 to be stored therein.

Thereafter the voltage of the source $V_3$ is adjusted by the signal source 23 to a second predetermined value resulting in a depletion zone bounded by the dotted line b in FIG. 5b. Because the control circuit which, under control of the current/voltage-converter 22, takes care of the adjustment of the voltage source $V_2$ functions independently, this voltage source $V_2$ will be adjusted to the new situation such that the depleted volume in the epitaxial n layer 11 underneath the depletion zone will shift downwards. The new boundary f' of this depleted volume just reaches to the boundary b of the upper depletion zone, so that again it is assured that the photo diode current is not influenced by diffusion from charge carriers out of the epitaxial n layer underneath the boundary b. The current, now flowing through the pn-photo diode junction is detected again by the converter 24 and stored as a voltage value in the analog memory 25.

Figure 6:
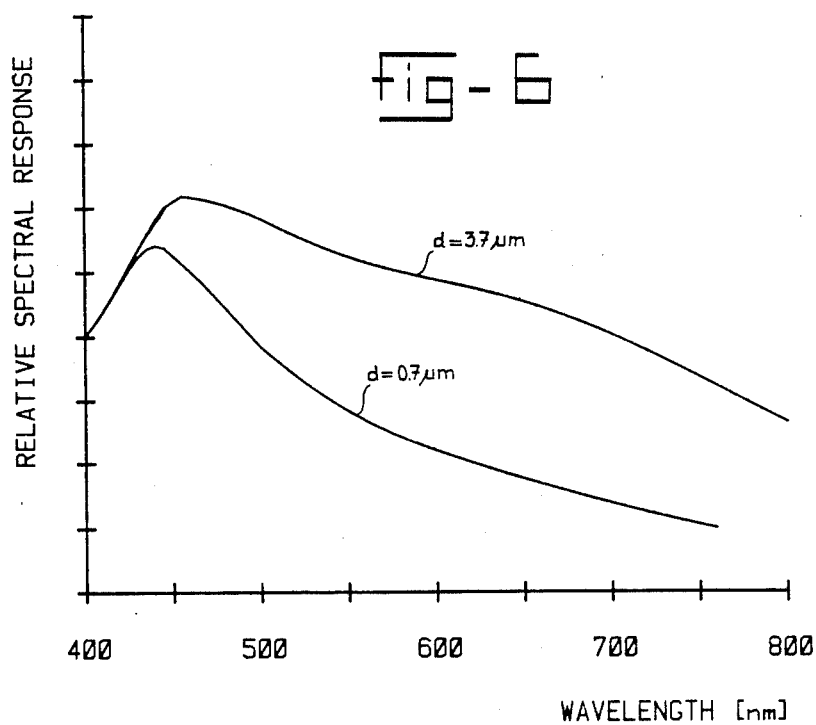
FIG. 6 illustrates the relative spectral response as a function of the wave-length for two different reverse voltages in the embodiment according to FIG. 5.

Suppose that the first reverse voltage was selected such that the depth of the dot line a is equal to $d=0.7$ $\mu m$ (see also FIG. 2) and that the second reverse voltage is selected such that the depth of the dot line b is equal to $d=3.7$ $\mu m$, then for an observation of the whole spectrum the spectral response as illustrated in FIG. 6 is obtained. Each curve shows in itself a filter behaviour. At $d=0.7$ $\mu m$ the contribution of red light to the photo current is smaller than the contribution of blue light. At $d=3.7$ $\mu m$ the contribution of red light is already significantly increased.

Figure 7:
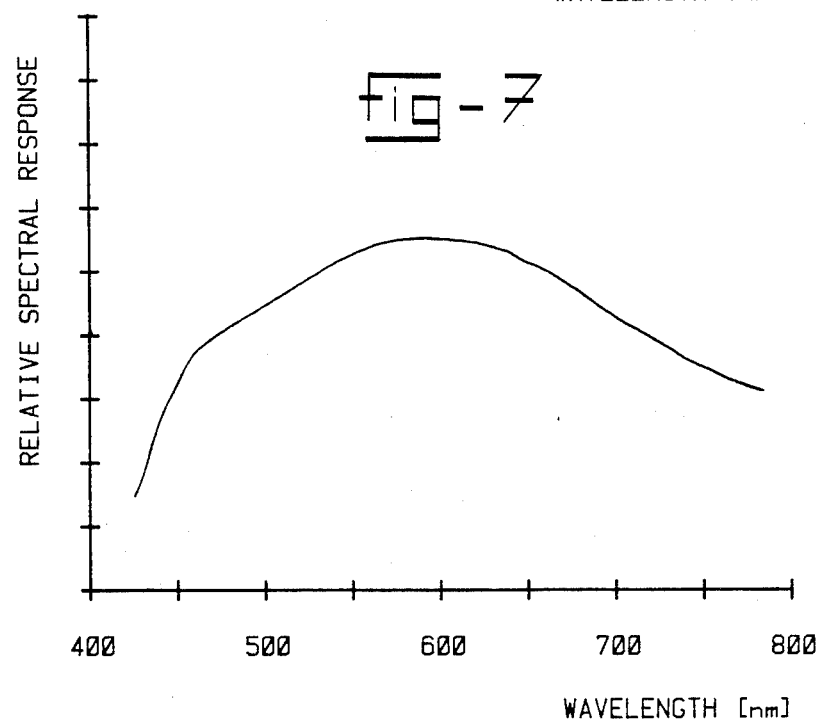
FIG. 7 illustrates the relative spectral response as a function of the wave-length after processing of the detected signals in the matrix processing unit.

An improved filter behaviour is obtained by combining the information from both measurements using an alogorithm of the type $$S(\lambda) = c_1 \cdot S(\lambda)_{d1} + c_2 S(\lambda)_{d1}$$

in which $S(\lambda)_{d1}$ = response curve in FIG. 6 for $d=d_1$
$S(\lambda)_{d2}$ = response curve in FIG. 6 for $d=d_2$
$c_1$ = first matrix constant
$c_2$ = second matrix constant With a suitable choice of the constants $c_1$ and $c_2$, after carrying out this algorithm a response is obtained as is illustrated in FIG. 7. This Figure clearly illustrates a filter curve with a maximum transmission of the filter at $\pm 600$ nm.

The filter behaviour can be improved further by repeating the current detection one or more times for different reverse voltages. In case for instance a third reverse voltage $V_3$ is selected such that $d_3 = 1.7$ $\mu m$ (curve c in FIG. 5b) then the direct relative spectral responses as illustrated in FIG. 8 are obtained. By a suitable selection of the various constants $c_n$ and by applying thereafter the following matrix process $$S_1(\lambda) = c_1 S(\lambda)_{d1} + c_2 S(\lambda)_{d2} + c_3 S(\lambda)_{d3}$$
$$S_2(\lambda) = c_4 S(\lambda)_{d1} + c_5 S(\lambda)_{d2} + c_6 S(\lambda)_{d3}$$
$$S_3(\lambda) = c_7 S(\lambda)_{d1} + c_8 S(\lambda)_{d2} + c_9 S(\lambda)_{d3}$$

a group of filter responses as illustrated in FIG. 9 are obtained. In other words, by a correct selection of the matrix constants $c_n$, the red, green and blue contents of the impinging light can be determined from only three measured current values obtained by using one single photo diode. In a practical application the following constants were used in the matrix process:

$$\begin{array}{rrr} 10 & -6 & -2 \\ -7 & 12 & -5 \\ -2 & -4 & 5 \end{array}$$

not only delivering good results but furthermore providing a reasonable reproduction of the so-called eye-sensitivity curve.

It has already been remarked that charge carriers, diffusing from the p region 13 (FIG. 5) into the underlying depletion zone, will contribute to the photo current. This contribution, which is of special interest for the blue sensitivity of the sensor, is dependent on the diffusion length L of the charge carriers in the depletion zone. It furthermore appears that the transmission of light through the $SiO_2$ layer has influence on the photo-current. The influence of both will be explained with the help of the following theoretical description.

The probability of a photon being absorbed in between the abrupt junction at $x_j$ and the depth of the depleted region $x_j + d$ is:

$$\exp(-\alpha(\lambda)x_j)[1 - \exp(-\alpha(\lambda)d)]$$

and will result in a photo current at wave-length $\lambda$ equal to:

$$i_p(\lambda) = F_o(\lambda)[1 - R(\lambda)]\eta(\lambda) A e \exp(-\alpha(\lambda)x_j)[1 - \exp(-\alpha(\lambda)d)] \quad (1)$$

where:

$F(\lambda)$ = incident photons at wave-length $\lambda$.
$R(\lambda)$ = reflection coefficient at wave-length $\lambda$.
$\eta(\lambda)$ = internal quantum efficiency at wave-length $\lambda$.
$\alpha(\lambda)$ = absorption coefficient at wave-length $\lambda[m-1]$.
$A$ = photo diode surface area [$m^2$].

The internal quantum efficiency can be assumed to be constant within the considered spectrum.

The wave-length dependence of the reflection coefficient originates from two different effects. The interference between the optical radiation transmitted through the air-$SiO_2$ interface and the radiation reflected at the $SiO_2$-Si interface will result in a wave-length dependent equivalent flux. The interference depends largely on the thickness of the $SiO_2$ layer relative to the wave-length in the part of the considered spectrum. Furthermore the reflection coefficient at the $SiO_2$-Si interface is coupled to the absorption coefficient through the index of refraction and is therefore also wave-length dependent. Both effects combined will result in a transmitted flux into the silicon of:

$$(1 - R_1)(1 - R_2(\lambda)) \sqrt{1 + R_2(\lambda)^2 - 2 \cdot R_2(\lambda)\cos(4\pi a n_1/\lambda)} \quad (2)$$

where:

$R_1$ = reflection coefficient at the air-$SiO_2$ interface
$R_2$ = reflection coefficient at the $SiO_2$-Si interface
$n_1$ = refractive index for $SiO_2$ (1.5)
$n_2$ = refractive index for Si (3.5-5)
$a$ = thickness of the oxide layer (0.2 $\mu m$)

If the charge carriers generated in the remaining non-depleted part of the epilayer governed by the JFET, are efficiently removed then the wave-length dependency of the response is only influenced by that fraction of the generated charge carriers in the implanted top layer that are able to diffuse to the space charge region underneath. The equation describing this additional contribution to the detected photo current is:

$$i_d(\lambda) = \frac{\alpha(\lambda)L}{1 - \alpha(\lambda)L} F_o(\lambda)e(1 - R(\lambda))\eta A[\exp(-\alpha(\lambda)x_j) - \exp(-x_j/L)] \quad (3)$$

where L is the diffusion length [μm].

The total normalized photocurrent in the depleted layer as a function of the wave-length can be obtained by combining equation (1) and (3) and inserting (2), which yields:

$$i(\ ) = [Y(\lambda) + Z(\lambda) \cdot \cos(1200\pi/\lambda)] [\exp(-\alpha(\lambda)x_j) (1 - \exp(-\alpha(\lambda)d)) + (\alpha(\lambda)L/(1 - \alpha(\lambda)L)) (\exp(-\alpha(\lambda)x_j) - \exp(-x_j/L))] \quad (4)$$

This equation shows a response which is partly determined by the fixed optical bandpass filter, controlled by the thickness of the oxide layer, and partly by the tunable function which is controlled by the size of the depleted layer.

FIG. 10 illustrates the influence of different diffusion lengths L for charge carriers which are able to diffuse from the p region 13 into the depletion zone for two different depths d of the depletion zone. This Figure shows clearly that a suitable choice of the diffusion length, which can be influenced by a suitable choice of the doping profile of the semiconductor structure, has influence especially on the blue sensitivity of the sensor.

Although in the foregoing a sensor structure is described in which only one light sensitive element is contained it will be clear that an array of such light sensitive elements can be constructed, each comprising only one light sensitive pn-junction.

Figure 11A:
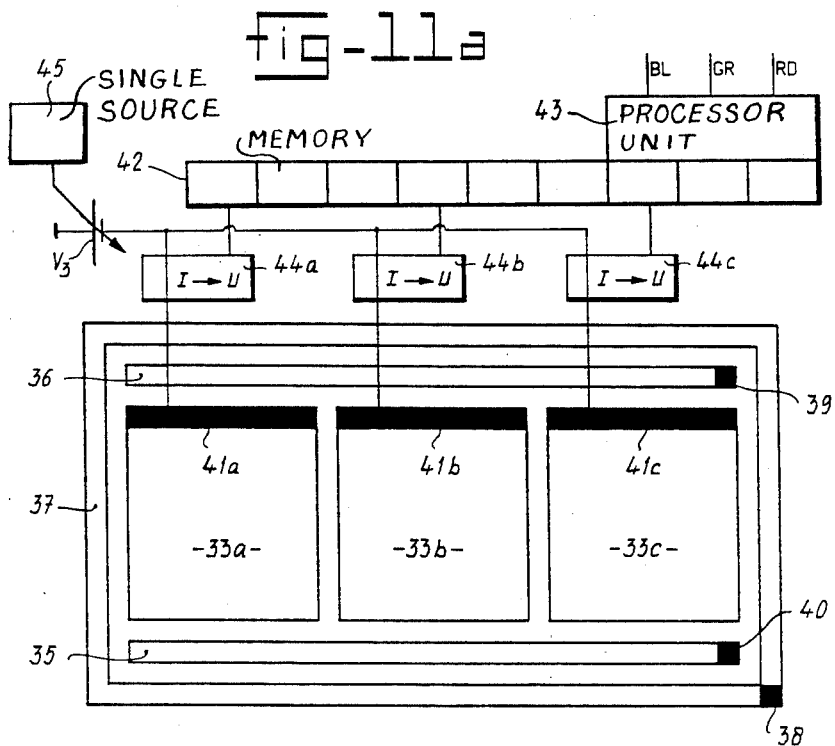
FIG. 11 illustrates schematically a second embodiment of a sensor structure according to the invention.
Figure 11B:
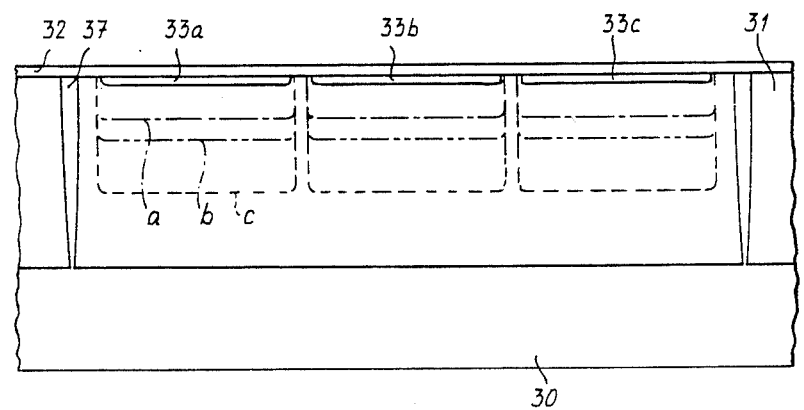

FIG. 11 illustrates an array of three sensor elements, consisting of a p substrate 30, a thereon positioned epitaxial n layer 31 with therein three doped p layers 33a, 33b and 33c as well as on top thereof an SiO2 layer 32. As is illustrated in the top view of FIG. 11a (without SiO2 layer) there are further elongated n doped regions 35 and 36 which together with the epitaxial n layer 31 form a JFET, the gates of which are formed by the p layers 33a, 33b and 33c on the one hand and the p substrate on the other hand, in a similar way as is illustrated in FIG. 5. The various metallizations for the substrate, source and drain of the JFET and the various p layers are indicated without their detailed connections to the various voltage sources. In fact the connection of this semiconductor structure to the voltage sources V1, V2 and V3 is identical to the configuration illustrated in FIG. 5a with the exception that the voltage source V3 is connected through the respective metallizations 41a, 41b and 41c to each of the p layers 33a, 33b and 33c. The p layers are embodied without a guard ring in this case because, as is known to the expert in this field, other measures can be taken to increase the punchthrough voltage.

The various p regions 33a, 33b and 33c are connected to an analogous memory embodied as a charge coupled transport channel 42. Devices of this type are commonly known and the functioning thereof needs no detailed explanation. During the time that each of the reverse voltages is set, a certain amount of charge is collected in said CCD the amount being dependent on the photocurrent delivered by the respective photo diode. After applying all the necessary different reverse voltages and after transporting the various accumulated charges through the device, these charges reach the processor unit 43 in which the matrix calculation is carried out such that at the outputs BL, GR and RD (the respective color signals for the colors blue, red and green) are delivered.

It will be clear that instead of a CCD device, in which in fact the current/voltage converting function and the analogous memory function are combined, other devices can be used.

It will furthermore be clear that the structure is not restricted to three light sensitive sensor elements, instead thereof an array of in general n×m sensor elements can be realized in this way.

Although with reference to FIG. 11 attention is drawn to the possibility to get, using only three different reverse votages, sufficient information to determine the red, green and blue contents in the impinging light, it will be clear that an increasing number of reverse voltages will lead to an increasing accuracy in the determination. If a relatively large number of reverse voltages is supplied sequentially such that the depth d of the depletion zone is sequentially stepwise increased as schematically illustrated in FIG. 12, then a corresponding large number of detected current values are obtained which after processing in the matrix processing unit will result in a series of relatively narrow response curves. With a relatively large number of different reverse voltages therefore a relatively large number of relatively steep filter curves can be realized. A sensor circuit functioning in this way can be used as spectrum analyser.

Figure 13A:
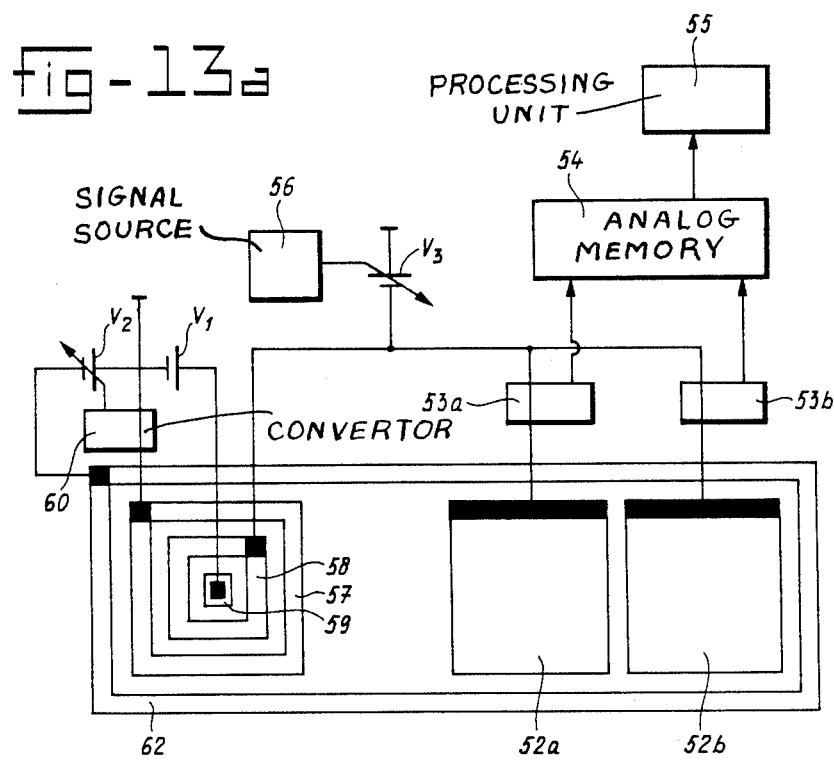
FIG. 13 illustrates the application of a separately positioned depletion detector.

In the embodiments illustrated in the FIGS. 5 and 11, the JFET is realized by means of elongated doped areas alongside the light sensitive diode junctions. It is, however, preferred to position the JFET at a separate position in the semiconductor material apart from the actual photodiode array. FIG. 13 illustrates such an embodiment in which the depletion detection element is illustrated at the left side, whereas two photo sensitive diode structures are illustrated at the right hand. It will be clear that these two photodiode structures may form only part of a larger array of diodes.

The structure illustrated in FIG. 13 comprises the p substrate 50, the epitaxial n layer 51 thereon and in said layer the p doped regions 52a and 52b defining the light sensitive pn junctions. The regions 52a and 52b are, in the illustrated way, connected to the voltage source V3 which is controlled by the signal source 56. The photo currents are detected by the convertors 53a and 53b supplying the detected current values to the analog memory 54 which in turn supplies output signals to the processing unit 55. So far the structure is identical to the structure illustrated in FIG. 5 or FIG. 11, making a further explanation superfluous.

At the lefthand side in FIG. 13 a separate detection element is illustrated consisting of the p doped ring shaped region 58 and the n doped ring shaped region 57, both positioned around an n doped centrally located region 59. The p doped ring 58 has the same function as the p doped regions 52a and 52b and is therefore connected to the same voltage source $V_3$, however, this p doped ring shaped region does not necessarily have to be light transmittent. Underneath said p doped region therefore a depletion zone is created extending to the same depth as the depletion zones underneath the regions 52a and 52b. Only the further shape of this depletion zone is different. The n doped ring shaped region 57 functions as source whereas the n doped central region 59 functions as drain of the JFET structure. The voltage between the source 57 and the substrate 50 is, in the same way as was discussed with reference to FIG 5, adjusted by means of a controllable voltage source $V_2$, controlled by the convertor 60 by means of which the current through the JFET is measured. Between the source and drain of the JFET the voltage source of $V_1$ is connected.

Figure 13B:
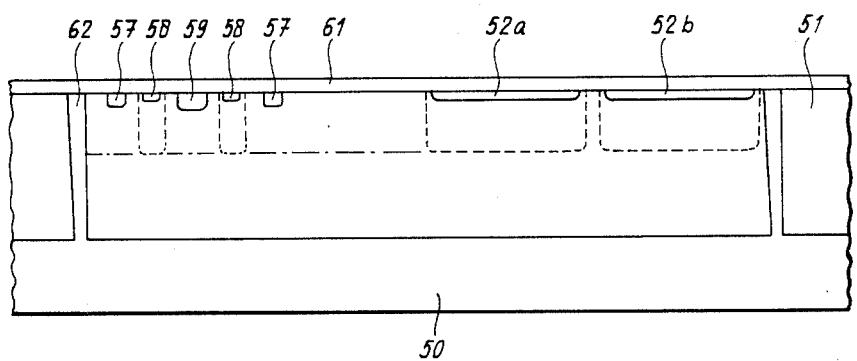

The depleted zone, which at the side of the substrate 50 is formed in the epitaxial layer 51 as result of the connection to the voltage source $V_2$, is extended to a height which is in FIG. 13b indicated by means of a dot-dash-line. Referring back to the explanation given with reference to FIG. 5, it will, referring especially to FIG. 13b, be clear that the complete depletion of the remaining epitaxial layer underneath the depletion zones formed underneath the light sensitive pn junctions can be adequately detected by means of this separately positioned JFET.

It can be a disadvantage in some applications that the color filtering will take more time as the number of different reverse voltages increases. In that case it might be preferable to realize, based on the inventive concept, a color sensitive sensor circuit which is not functioning in time multiplex but in position multiplex. Such a position multiplex circuit is illustrated in FIG. 14.

Figure 14A:
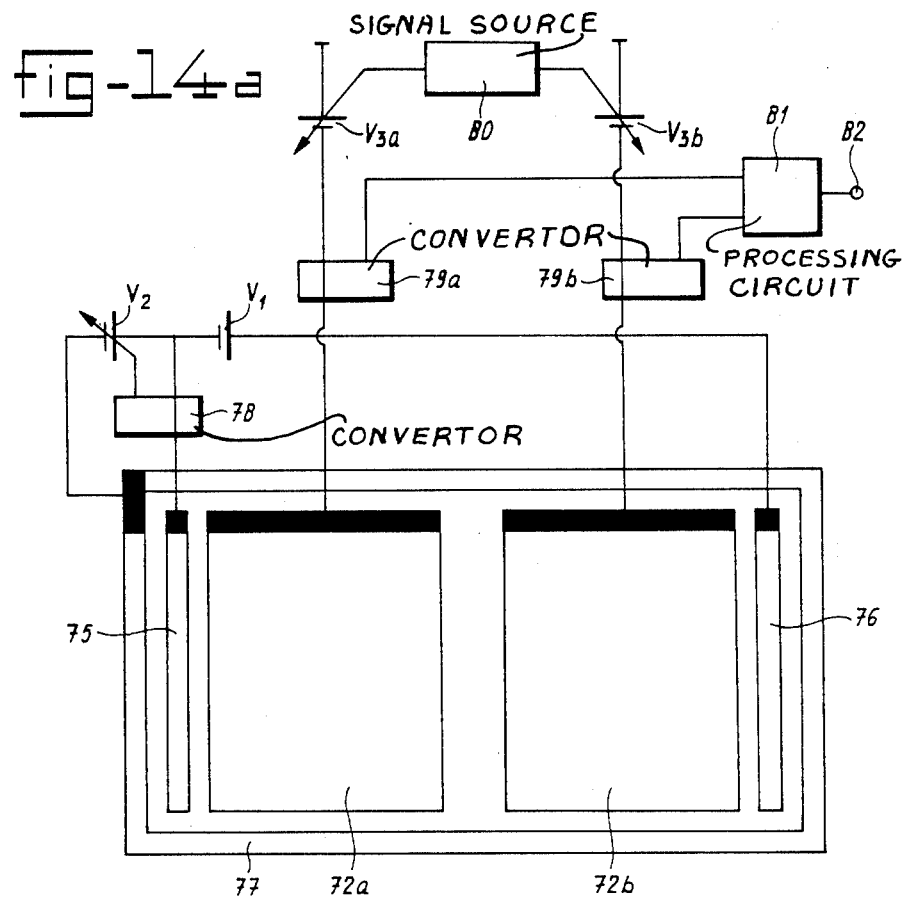
FIG. 14 illustrates a position multiplex embodiment of the sensor circuit according to the invention.
Figure 14B:
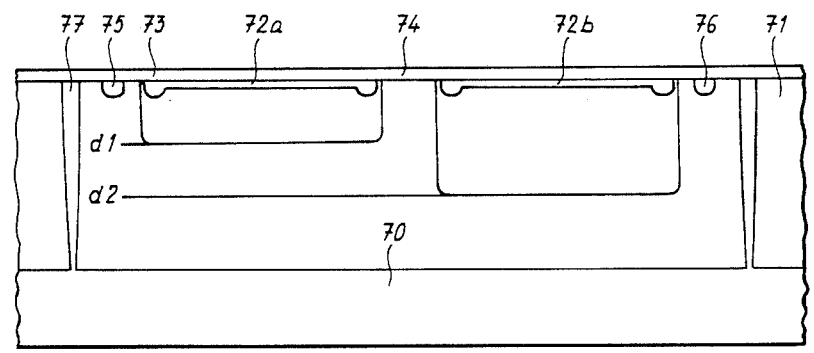

The semiconductor of FIG. 14 comprises a p substrate 70 with thereon an epitaxial n layer 71 and p doped regions 72a and 72b therein, defining together with the epitaxial layer the light sensitive pn junctions. The substrate 70 is connected through the p doped ring shaped region 77 to the metallization shown in FIG. 14a. The metallizations are not specifically indicated by reference numbers. In the epitaxial n layer further n doped regions 75 and 76 are realized functioning as a JFET.

As is illustrated in FIG. 14a both p regions 72a and 72b are connected each to a known controllable voltage source $V_{3a}$ and $V_{3b}$ respectively, the voltage of each being controlled by a signal source 80. The currents through both photo diodes are measured using convertors 79a, respectively 79b, the output signals of which are directly supplied to a processing circuit 81, delivering at its output 82 the filter output signal.

Both voltage sources $V_{3a}$ and $V_{3b}$ are controlled by the signal unit 80 such that they present a different reverse voltage to the respective diode structure such that underneath the p doped region 72 a depletion zone extending to a depth d1 is created whereas under the p doped region 72b a depletion region extending to a depth d2 is created. In the same way as described with reference to FIG. 5, the remaining part of the epitaxial n layer 71 is depleted by means of a correct adjustment of the voltage $V_2$ on the basis of a control signal delivered by the convertor 78 such that the depleted volume extends from the substrate 70 up to the level indicated by d2. Therewith, the epitaxial n layer 71 underneath the p doped region 72b is completely depleted. However, underneath the region 72a the volume between the levels d1 and d2 is not completely depleted. The charge carriers generated in this intermediate layer will for one part diffuse to the above positioned depletion zone and in that case contribute to the photo current, but for the other part diffuse to the depletion zone underneath the level d2.

If the level d2 is for instance positioned at a depth of d=3.7 $\mu$m and the level d1 is positioned at a depth of d=0.7 $\mu$m, then the relative spectral response of the right hand pn junction will completely correspond with the corresponding curve illustrated in FIG. 6. The relative spectral response of the left hand pn junction, however, will, as result of the diffusion of charge carriers from the intermediate non-completely depleted volume, show some deviations. Especially the contribution of light with larger wave length will increase so that the blue sensitivity is decreased because of the presence of this non-completely depleted epitaxial volume in the epitaxial layer. However, this effect appears not to be of such impact that the functioning of the sensor is deteriorated significantly. After processing the detected current values in the matrix processing circuit 81, a very useful result is obtained which only in a minor sense deviates from the result obtained by the sensor circuit in FIG. 5. On the other hand the circuit of FIG. 14 has the advantage that no memory is necessary for intermediate storage of the detected currents as is necessary in the circuit according to FIG. 5.

Figure 15A:
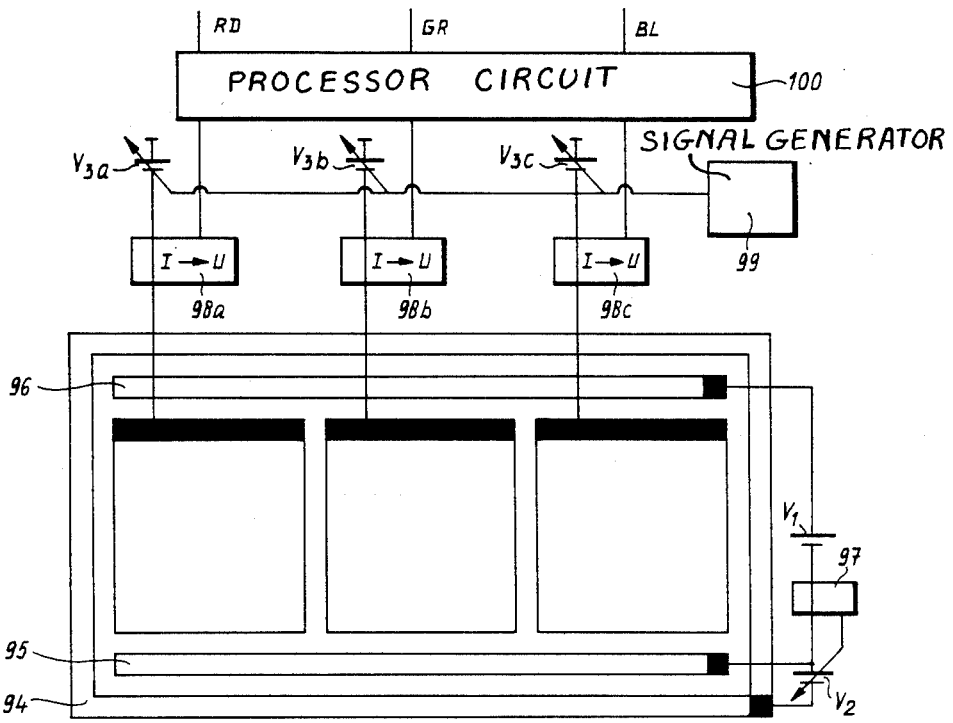
FIG. 15 illustrates a further position multiplex embodiment of the sensor circuit according to the invention.
Figure 15B:
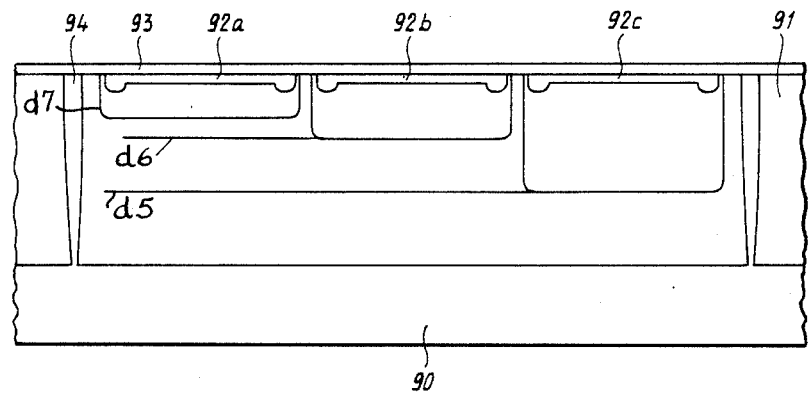

Also the position multiplex embodiment is not restricted to two diodes but can be extended to an array with an arbitrary number of diodes. An array with three diodes is illustrated in FIG. 15. The semiconductor structure comprises the p substrate 90, an epitaxial n layer 91 thereon and therein three p doped regions 92a, 92b and 92c. The structure is covered by the $SiO_2$ layer 93. The substrate 90 is connected through the p doped ring shaped region 94 to the metallization at the surface. Furthermore the elongated n doped regions 95 and 96 are present which, as will be clear from the foregoing description, are forming part of a JFET structure which, by means of the voltage sources $V_1$ and $V_2$ and under control of the converter 97, is adjusted such that at least the part of the epitaxial layer 91 underneath the level d5 in FIG. 15b is completely depleted.

The p doped regions 92a, 92b and 92c are connected to the respective voltage sources $V_{3a}$, $V_{3b}$ and $V_{3c}$ which are controlled by a signal generator 99 in such a way that underneath each of these regions a depletion zone is created respectively extending to the depth d7, d6 and d5. The generated photo currents are detected by the respective convertors 98a, 98b and 98c and the detected values are supplied to the processor circuit 100 in which the detected values are subjected to a matrix process resulting into the output signals RD (red), GR (green) and BL (blue).

Also this circuit has the disadvantage tht the epitaxial n layer underneath the p doped regions 92a and 92b is not completely depleted. On the other hand, however, the contribution of the charge carriers diffusing from this non-completely depleted voloume to the depletion zones above is not such that the obtained result would be unworkable. After processing the detected values in the matrix process circuit 100, a relative spectral response is obtained which is comparable with the response illustrated in FIG. 9.

A circuit of the type of FIG. 15, however, extended to a number of n pn junctions (in which the number n is relatively large) may be used with good results for realizing a spectrum analyzer which, without the time loss which would appear in the time multiplex equivalent, supplies the results of the spectrum analysis directly to the outputs of the processing circuit.

Figure 16A:
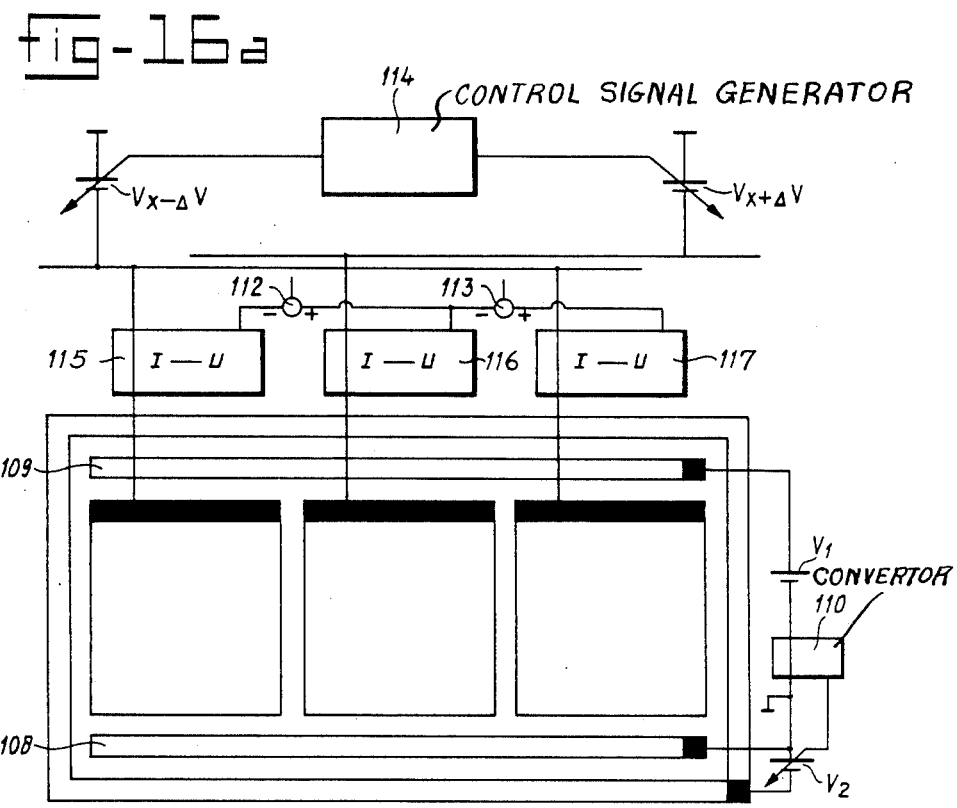
FIG. 16 illustrates an embodiment in which both position multiplex as well as time multiplex is applied.

FIG. 16 illustrates an embodiment in which both position multiplex as well as time multiplex is used. The semiconductor structure in this embodiment consists of a substrate 101, an epitaxial n layer 102 thereon and the therein p doped regions 103, 104 and 105 as well as the covering SiO$_2$ layer 106. Furthermore the n doped regions 108 and 109 are present belonging to the JFET structure, such structure being adjusted by means of the voltage sources V$_1$, V$_2$ and the converter 110 in the same way as described before. The p substrate 101 is connected through the doped ring shaped region 107 to the metallization on the surface.

The p regions 103 and 105 are connected to a voltage source V(x−Δx) whereas the p region 104 is connected to the voltage source V(x+Δx). Both mentioned voltage sources supply a voltage of such an amplitude that the depletion level underneath the respective diode is extending to a depth x−Δx respectively x+Δx, in other words such that the average depletion level for two adjacent diodes is positioned at the level x. By means of the control signal generator 114 both voltage sources can be adjusted simultaneously such that the level x can be shifted to any desired level. The diode currents are detected by means of the convertors 115, 116 and 117 and supplied to the subtractors 112 and 113, functioning together as matrix processor in this case.

Figure 16B:
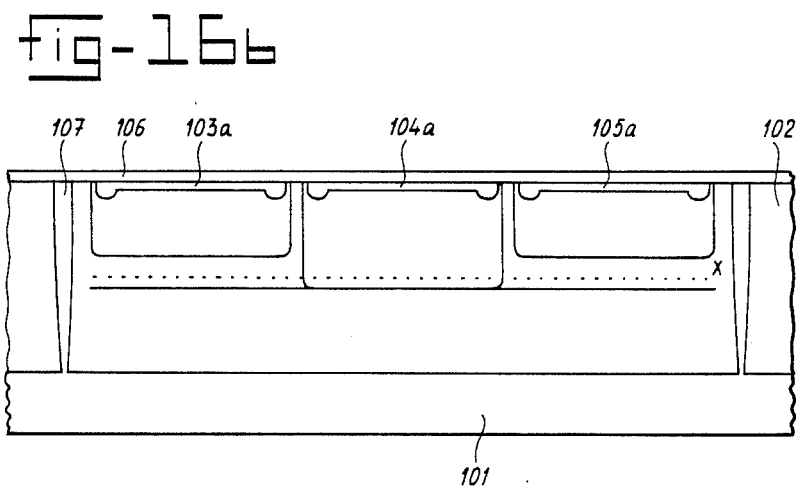

It is noted that in the FIG. 16b the level x is indicated somewhat under the actual average level because the diffusion of charge carriers from the small non-completely depleted intermediate volume in the upwards and downwards directions is not equal. It is furthermore noted that the influence of the diffusion of charge carriers from this intermediate volume will, certainly if Δx is selected small, be insignificant.

The light impinging onto the p regions 103 and 104 will result, after combination of the generated photo currents in the subtractor 112, into a response with a sharp peak at exactly that wavelength for which the contribution to the photo current at the depth X is maximum. The light impinging onto the p layers 104 and 105 will result, after combination of the photo currents in the subtractor 113, in a response which also has a maximum for exactly that wavelength for which the contribution at the depth X is maximum. In other words, the illustrated structure of three diodes in fact is a sensor for sensing two adjacent light sources. It is very easy to extend this structure to a linear array of n+1 photo diodes suitable for sensing n adjacent light sources. To get a complete scan of the spectrum it is only necessary to control the voltage sources by means of the signal source 114 such that the whole series of subsequent reverse voltages resulting in average depletion zones for a predetermined number of values of x is supplied to get a total response for all photo diodes simultaneously.

Although in the above description a number of embodiments of sensor circuits according to the invention are described it will be clear that the invention is not restricted to these embodiments.

Instead of the JFET as the depletion detection element, for instance, a capacity measuring circuit can be connected between the p doped top layer and the non-depleted part of the epitaxial layer. The capacity therebetween will, at the moment that complete depletion is reached, show a sharp decrease, which decrease forms a suitable detection criterium.

Furthermore instead of the current/voltage-convertors for detecting the photodiode current it is possible of course to use other detection or converting circuits, one possible solution being to use the CCD device as described with reference to FIG. 11a. CCD devices have the advantage that the function of the current/voltage-convertors and the analogous memory function are in fact combined into one device resulting into a rather simple configuration which can be integrated as a whole very easily.

I claim:

1. A method of determining the wavelength of light, comprising the steps of:
   receiving said light with a light-sensitive semiconductor element comprising a substrate of a first conductivity type, a layer of a second conductivity type disposed on said substrate, and a region of said first conductivity type disposed on said layer;
   applying at least two different reverse voltages across said layer and said region, said reverse voltages creating a depletion zone in said layer beneath said region and also completely depleting a portion of said layer, beneath said depletion zone; and
   determining a photocurrent through said semiconductor element, said photocurrent being indicative of the wavelength of said light.

2. A method according to claim 1 wherein said applying step includes the step of applying the at least two different reverse voltages sequentially across said layer and said region.

3. A method according to claim 1 wherein said receiving step includes the step of receiving said light with a plurality of light-sensitive semiconductor elements, and wherein said applying step includes the step of applying, for each of said plurality of light-sensitive semiconductor elements, at least two different reverse voltages simultaneously across the respective layer and region.

4. A method according to claim 1 wherein said applying step includes the steps of:
   completely depleting said portion of said layer beneath said depletion zone by applying one of said two different reverse voltages between said substrate and said layer;
   controlling said one reverse voltage with a depletion detection mechanism such that the depleted portion extends just to said depletion zone without overlap.

5. A method according to claim 4 wherein said controlling step includes the step of controlling said one reverse voltage with a depletion detection mechanism comprising a junction field effect transistor formed by two additional regions of said second conductivity type disposed on said layer, said layer forming a channel of said junction field effect transistor, a current through said junction field effect transistor being measured whereby complete depletion of the layer is detected where said junction field effect transistor is at a point of pinch-off.

6. A method according to claim 4 wherein said controlling step includes the step of controlling said one reverse voltage with a depletion detection mechanism comprising a capacitance measuring unit measuring a capacitance between said region of said first conductivity type and other portions of said layer, the complete depletion of said layer being detected by a sharp drop in said capacitance.

7. Apparatus for determining the wavelength-light, comprising:
   a light-sensitive semiconductor element including a substrate of a first conductivity type, a layer of a second conductivity type disposed on said substrate, and a region of said first conductivity type disposed on said layer;
   means for applying a first reverse voltage across said layer and said region for creating a depletion zone in said layer;
   means for applying a second reverse voltage across said layer and said substrate for completely depleting a portion of said layer beneath said depletion zone; and
   means for determining a photocurrent through said semiconductor element, said photocurrent being indicative of the wavelength of said light.

8. A color-sensitive sensor circuit comprising:
   a light-sensitive semiconductor element including a substrate of a first conductivity type, a layer of a second conductivity type disposed on said substrate, and a region of said first conductivity type disposed on said layer, said region forming together with said layer a photo diode;
   first voltage source means connected to said photo diode, for generating a first depletion zone in said layer beneath said region;
   second voltage source means connected between said substrate and said layer, for creating a second depletion zone in said layer beneath said first depletion zone;
   current detection means connected to said photo diode, for detecting a photocurrent through said photo diode; and
   processing means for (a) generating a control signal for said second voltage source means such that at a predetermined voltage of said first voltage source means said second voltage source means applies a voltage to cause said first and second depletion zones in said layer to be just adjoining, (b) detecting photo diode current for at least two different voltages of said first voltage source means, and (c) comparing the photo diode currents with each other to extract information concerning the wavelength of light impinging said element.

9. Apparatus according to claim 8 wherein said processing means includes means for applying said two different voltages of said first voltage source means sequentially, and further including memory means coupled to said current detection means, for storing the detected photocurrent for said two different voltages of said first voltage source means, said memory means providing the stored photocurrent values to said processing means simultaneously.

10. Apparatus according to claim 9 wherein said first voltage source means generates a stepwise continuously increasing voltage corresponding to a predetermined filter curve slope.

11. Apparatus according to claim 8 further including:
   a plurality of light-sensitive semiconductor elements disposed with said light-sensitive semiconductor element to form an n×m array of light-sensitive elements, all of said light-sensitive semiconductor elements being coupled to said first voltage source means, said second voltage source means, and said processing means;
   a plurality of current detection means, each coupled to a respective one of said light-sensitive elements, for detecting photocurrent through said respective light-sensitive element; and
   a plurality of memory means, each coupled to a respective one of said plurality of current detection means, for storing a detection photocurrent through each of said light-sensitive elements.

12. Apparatus according to claim 11 wherein said processing means includes means for receiving in a group the plurality of detected photocurrents from said plurality of current detection means.

13. Apparatus according to claim 11 wherein said n×m array of light-sensitive elements is disposed on a single substrate of said first conductivity type, a single layer of said second conductivity type comprising the layer of each of said elements forming said n×m array, a plurality of doped regions of said first conductivity type forming the regions of each of said light-sensitive elements forming said n×m array.

14. Apparatus according to claim 8 further including an additional light-sensitive semiconductor element forming an additional photo diode, and an additional current detection means coupled to said additional photo diode for detecting an additional photocurrent through said additional photo diode, and wherein said first voltage source means includes means for applying one of said two different voltages to said photo diode and the other of said two different voltages to said additional photo diode, and wherein said processing means includes means for simultaneously receiving the detected photo currents from both said current detection means and said additional current detection means.

15. Apparatus according to claim 14 wherein said voltage source means includes means for applying said two different voltages such that said one different voltage is larger than said other different voltage, and wherein said processing means includes means for generating said control signal such that the second depletion zone adjoins the first depletion zone underneath the region to which said one different voltage has been applied.

16. Apparatus according to claim 8 wherein said processing means includes junction field effect transistor means for detecting the adjoining of said first and second depletion zones, said junction field effect transistor means including:
   first and second doped regions of said second conductivity type disposed on said layer, said first region forming a drain and said second region forming a source, said layer acting as a channel for said junction field effect transistor means, said substrate and at least one of said first and second doped regions forming a gate of said junction field effect transistor means, said junction field effect transistor means being coupled to said current detection means for detecting said photocurrent through said photo diode.

17. Apparatus according to claim 16 wherein said one of said doped regions forming said gate of said junction field effect transistor means is a separate doped region connected to said first voltage source means and unconnected to said photo diode.

18. Apparatus according to claim 8 wherein said processing means includes capacity measuring means for measuring a capacity between said layer and said region in order to detect the adjoining of said first and second depletion zones.

19. Apparatus according to claim 8 wherein said processing means includes linear matrix processing means for generating m output signals from n input signals received from said current detection means by using a n×m matrix of constants, each of said m output signals being representative of a contribution from a specific part of the light spectrum.

* * * * *